United States Patent [19]
Morrison

[11] Patent Number: 5,057,968
[45] Date of Patent: Oct. 15, 1991

[54] COOLING SYSTEM FOR ELECTRONIC MODULES

[75] Inventor: Robert A. Morrison, Long Beach, Calif.

[73] Assignee: Lockheed Corporation, Calabasas, Calif.

[21] Appl. No.: 422,181

[22] Filed: Oct. 16, 1989

[51] Int. Cl.[5] .................................................. H05K 7/20
[52] U.S. Cl. ....................... 361/385; 165/80.4; 165/104.33; 211/41; 361/415
[58] Field of Search .............. 211/41; 357/82; 62/418; 361/382, 383, 386–388, 385, 415; 165/80.4, 104.26, 104.33; 174/15.2, 16.3

[56] References Cited

U.S. PATENT DOCUMENTS

| | | | |
|---|---|---|---|
| 3,917,370 | 11/1975 | Thornton et al. | 339/16 |
| 3,989,099 | 11/1976 | Hosono et al. | 165/80 |
| 4,315,300 | 2/1982 | Parmerlee et al. | 361/382 |
| 4,382,271 | 5/1983 | Villemont et al. | 361/386 |
| 4,493,010 | 1/1985 | Morrison | 165/104.33 |
| 4,536,824 | 8/1985 | Barrett | 361/388 |
| 4,712,158 | 12/1987 | Kikuchi et al. | 361/385 |
| 4,775,260 | 10/1988 | Kecmer | 361/415 |
| 4,829,402 | 5/1989 | Gewebler | 361/415 |

Primary Examiner—Gerald P. Tolin

[57] ABSTRACT

The invention is a cooling system for electronic circuit modules such as a printed circuit boards. In detail the invention comprises a housing assembly having first and second opposed plates. The opposed plates include a plurality of spaced guide rails thereon. A plurality of electronic modules each having a metallic frame, are slidably mounted in the opposed guide rails and detachably clampable thereto. A cooling system is included, which comprises: each of the guide rails having internal cooling passages, preferably in a serpentine pattern, with the cooling passages extending from the first and second ends of the rails; and each of the opposed plates having a coolant inlet passage and a coolant outlet passage coupling each end in parallel. A coolant flow control system is provided which insures that phase change cooling is accomplished within the serpentine shaped guide rails.

2 Claims, 4 Drawing Sheets

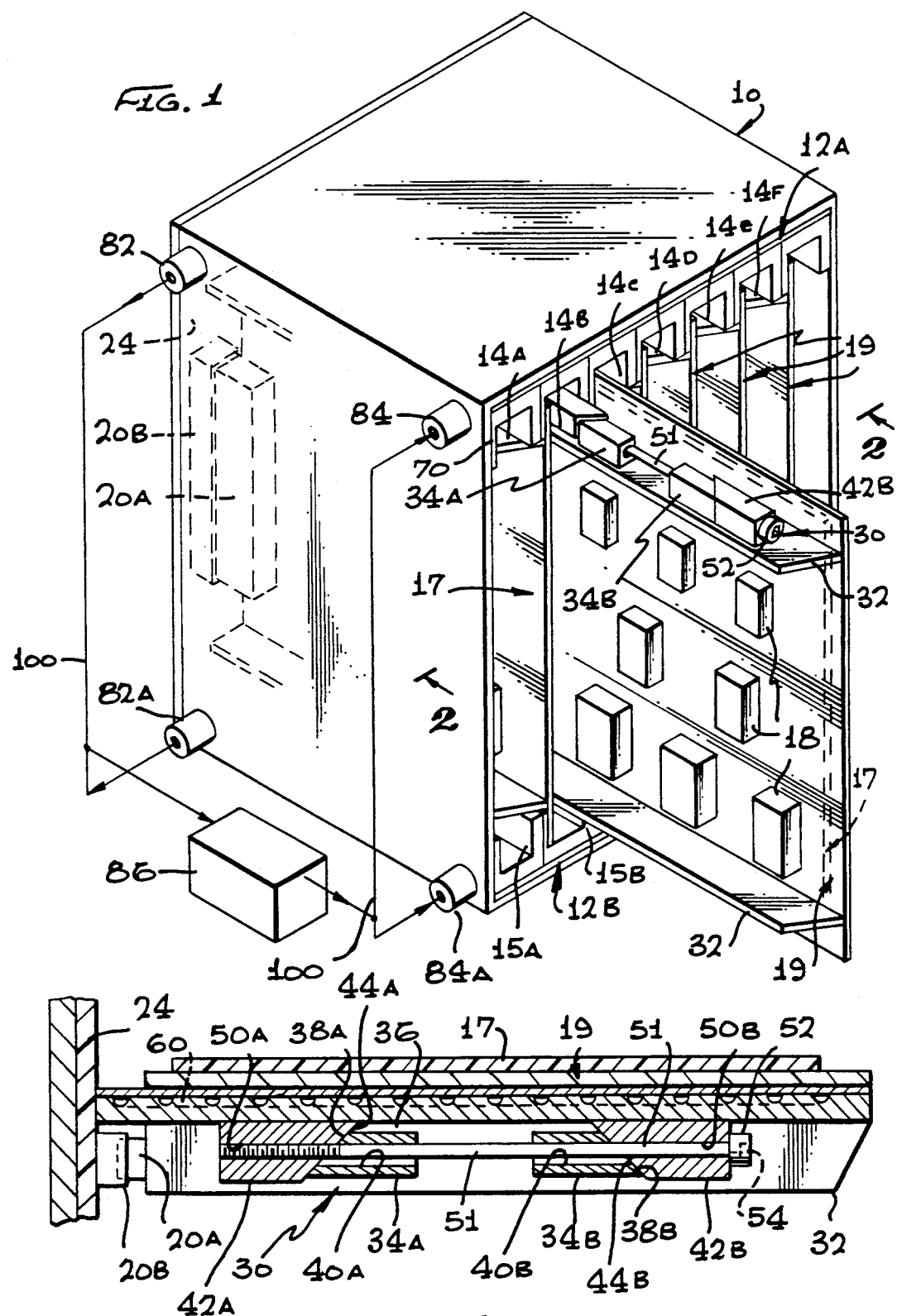

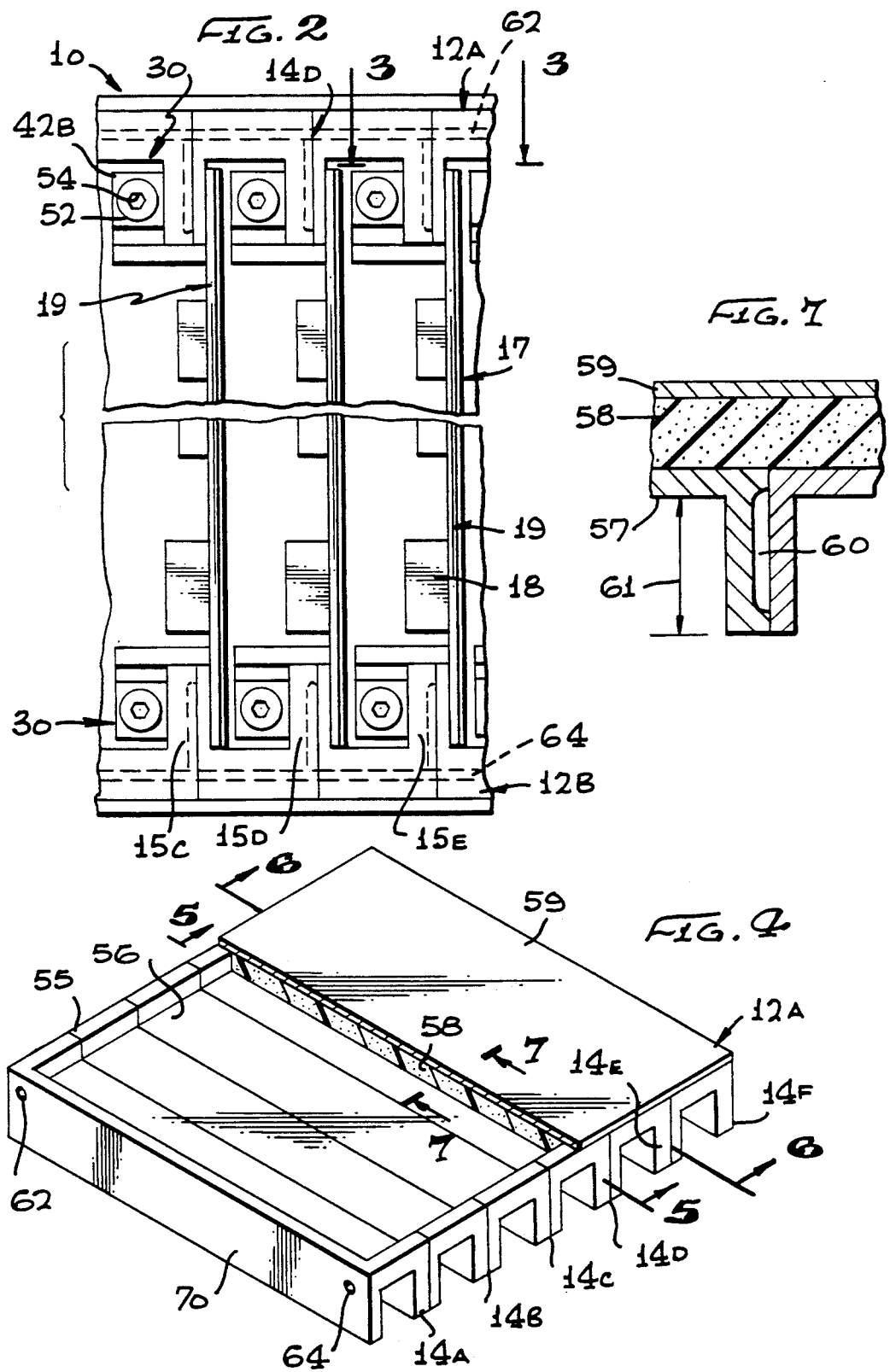

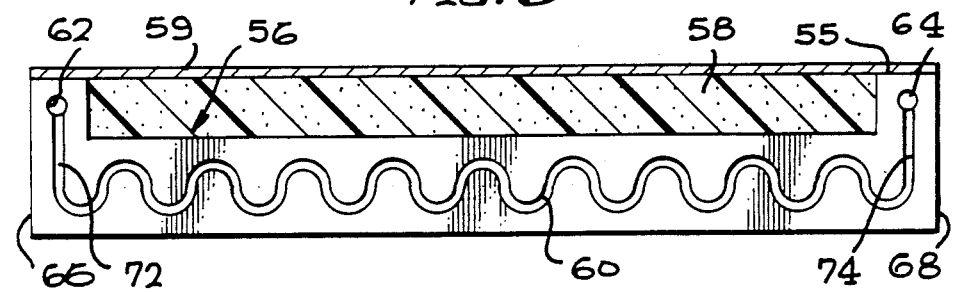
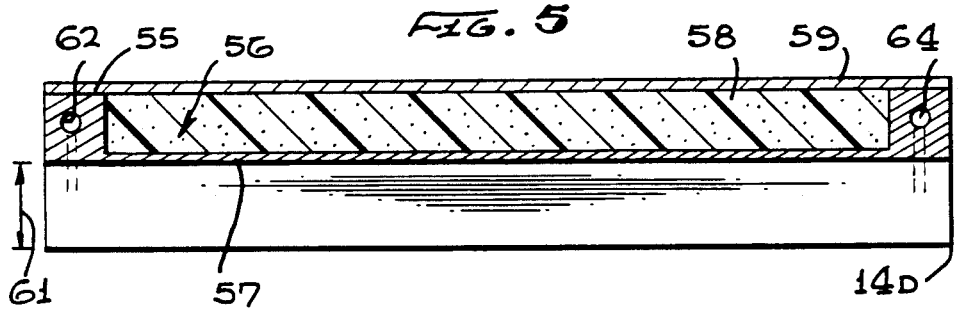
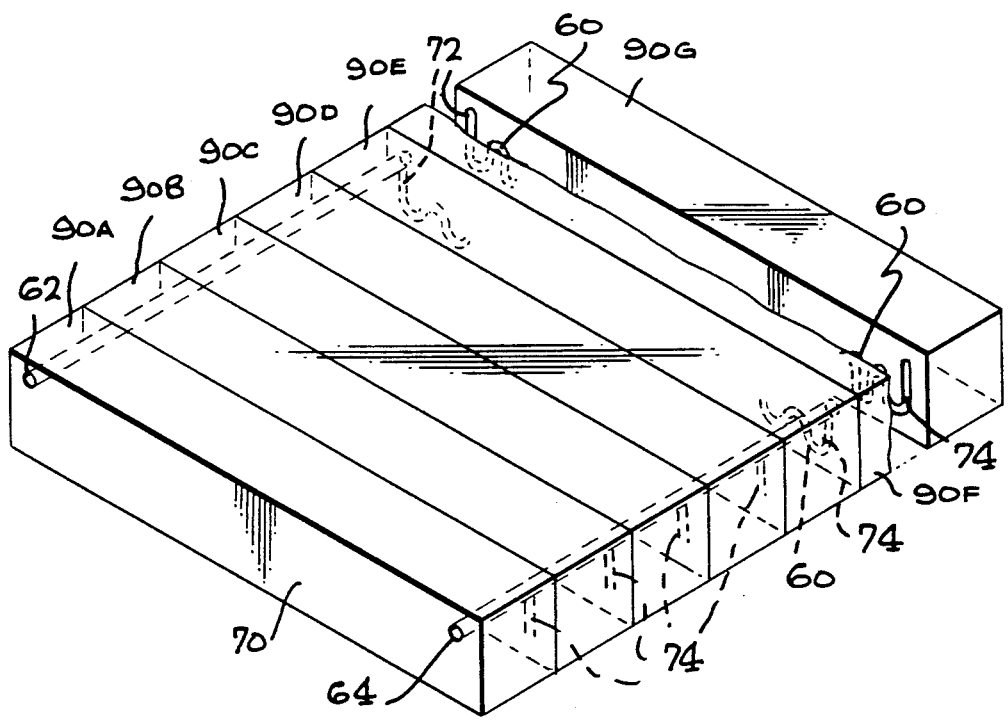

COOLING SYSTEM FOR ELECTRONIC MODULES

TECHNICAL FIELD

The invention relates to the field of cooling systems for heat generating electronic circuitry and, in particular, to a liquid and/or phase change cooling system for electronic circuit board modules.

BACKGROUND INFORMATION

In electrical equipment on-board aircraft, low weight and compactness are critical parameters in the design thereof. In order to more easily repair and replace individual electronic components, most of them are mounted on easily removable circuit board modules. The circuit board modules are rack mounted in cabinets and, typically, are automatically plugged into mother boards upon insertion. The weight and size limitations require that they be closely packed in the cabinets and, since a great many of these components generate heat when in operation, both air and liquid cooling systems have been used. One such method is to clamp the circuit board modules to the mounting guide rails in the cabinet and use the guide rails to transfer and distribute the heat to a solid metal guide rail support plate. Cooling fluid is pumped over the back side of the plate absorbing the heat, and thus, transferring the heat out of the cabinet. However, for this system to be effective, the rail support plates must be relatively large in order to conduct the heat from the guide rails and effectively couple it to the circulating coolant fluid. This, of course, adds weight to the system.

In U.S. Pat. No. 4,315,300 "Cooling Arrangement for Plug-In Module Assembly" by James K. Parmerlee et al. the circuit boards are slideably mounted in grooved end plates which act as heat sinks. The end plates have straight-through coolant passages in the outer ends thereof for extraction of heat. Additionally, the circuit boards are spaced sufficiently apart to allow air to be fan driven down between the boards to provide additional cooling. However, this system provides no means for thermal clamping of the circuit boards to the walls of the grooves and the end plates still must be large in order to conduct heat from the groove walls. Additionally, the requirement for "air cooling" dictates that the circuit board modules be spaced apart, decreasing the density thereof.

U.S. Pat. No. 3,917,370 "Interconnect Device for Use in Closed Fluid Circulating Systems" by David C. Thornton et al. discloses a system for providing cooling fluid directly to individual components mounted on removable circuit board modules. While this system would be very effective in cooling the individual components, it is complicated and prone to leakage. Furthermore, changes in the design of the circuitry would necessitate a change in the design of the cooling system. U.S. Pat. No. 4,712,158 "Cooling System for Electronic Circuit Components" by Shunichi Kikuchi et al. and in U.S. Pat. No. 3,989,099 "Vapor Cooling Device for Semiconductor Device" by Isamu Hosono et al., both show additional methods of coupling cooling fluid directly to electronic components.

Also of interest in U.S. Pat. No. 4,382,271 "Electrical and Thermal Interconnection System for Electronic Circuit Boards and an Electrical Cabinet Fitted with Such a System" by Claude M. Villemont et al., in that it discloses a method of thermal clamping circuit board modules to more effectively transfer heat therefrom. However, in this final reference there are no provisions for liquid cooling.

Thus, it is a primary object of the subject invention to provide a system for effectively liquid or phase change cooling electronic circuit board modules.

Another primary object of the subject invention is to provide a system for effectively liquid cooling electronic circuit board modules which is light in weight.

It is a further object of the subject invention to provide an effective liquid cooling system for electronic circuit board modules which is both compact and thermally efficient.

DISCLOSURE OF THE INVENTION

The invention is a modular electronic system. In detail, the system comprises a housing assembly having first and second opposed principle plates. The plates include a plurality of spaced guide rails extending inward toward each other in an aligned one-on-one relationship. Further included are a plurality of electronic modules, typically in the form of circuit boards or components on metallic frames. The metallic frames include grooves at each end that are adapted to engage the guide rails and incorporate thermal clamps providing good thermal contact between the metallic frame and the guide rails.

A rack mounted cooling system is included which comprises the incorporation of internal cooling passages within each of the guide rails with the passages terminating in proximity to the ends of the guide rails. Preferably, the cooling passage within each guide rail is in a serpentine pattern therealong. Each of the opposed plates incorporates a coolant inlet passage perpendicular to the guide rails connecting one end of the serpentine cooling passage in each guide rail in parallel. A coolant outlet passage is also incorporated in each of the opposed plates perpendicular to the guide rails connecting the other end of the serpentine cooling passage in parallel.

Thus, when the electronic circuit board modules are clamped in place, coolant fluid can be provided to the inlet passages of both plates wherein it will be distributed into the internal serpentine passages in each guide rail, cooling the electronic circuit board modules, and thereafter returned for recycling in the outlet passages. A coolant flow control system is provided which insures that phase change cooling is accomplished within the serpentine shaped passages in the guide rails.

The novel features which are believed to be characteristic of the invention, both as to its organization and method of operation, together with further objects and advantages thereof, will be better understood from the following description in connection with the accompanying drawings in which the presently preferred embodiment of the invention is illustrated by way of example. It is to be expressly understood, however, that the drawings are for purposes of illustration and description only and are not intended as a definition of the limits of the invention.

BRIEF DESCRIPTION OF THE DRAWINGS

Illustrated in FIG. 1 is a perspective view of an electronic circuit board module cabinet.

Illustrated in FIG. 2 is a partial front view of the cabinet shown in FIG. 1 along the line 2—2.

Figure 9:
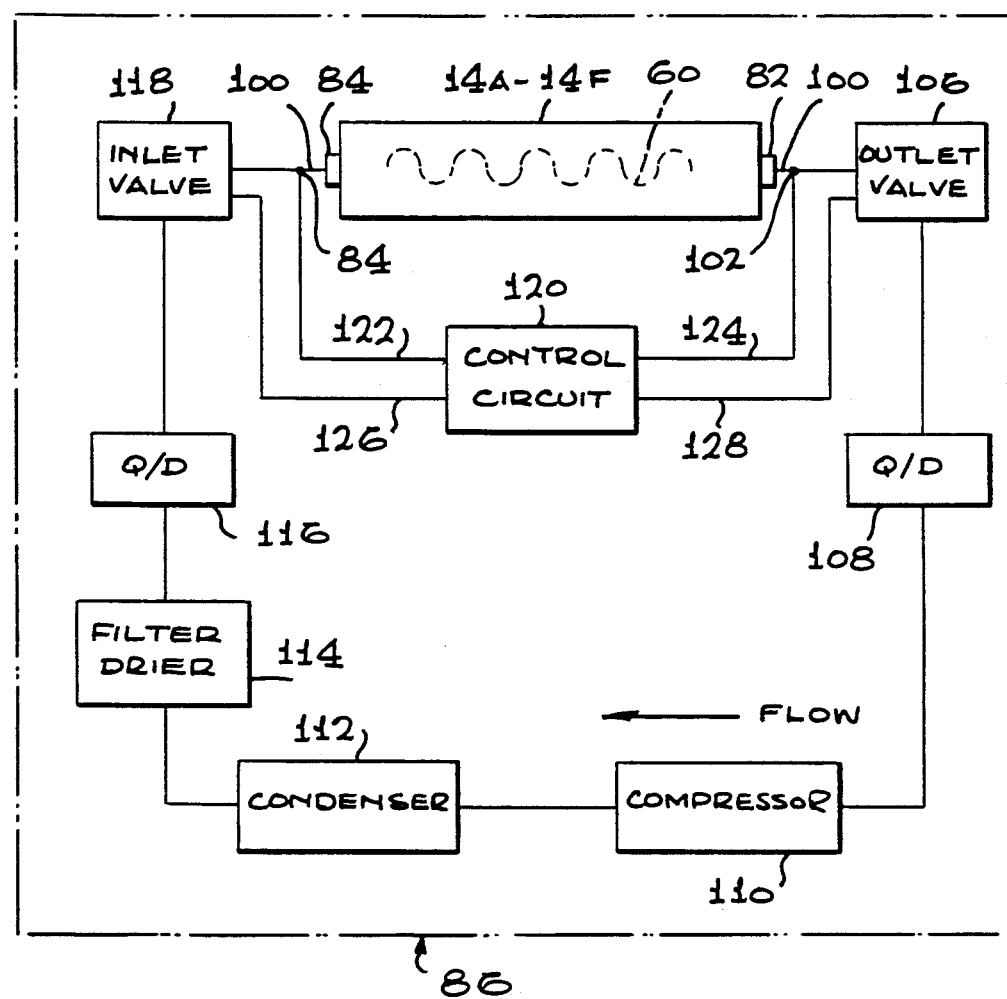

Illustrated in FIG. 3 is a partial cross-sectional view of FIG. 2 taken along the line 3—3.

Illustrated in FIG. 4 is a partially broken wave perspective view of one of the circuit board module mounting plates.

Illustrated in FIG. 5 is a cross-sectional view of FIG. 4 taken along the line 5—5.

Illustrated in FIG. 6 is a cross-sectional view of FIG. 4 taken along the line 6—6.

Illustration in FIG. 7 is a cross-section view of FIG. 4 taken along the line 7—7.

Illustrated in FIG. 8 is a perspective view of a method of making the mounting plates.

Illustrated in FIG. 9 is a schematic representation of the system to control coolant flow.

BEST MODE FOR CARRYING OUT THE INVENTION

Illustrated in FIG. 1 is a perspective view of an electronic equipment enclosure, generally designated by numeral 10, while illustrated in FIG. 2 is a view looking into the front of the Enclosure 10 shown in FIG. 1 along the line 2—2. The Enclosure 10 includes opposed circuit board module mounting plates 12A and 12B, having guide rails 14A through F, respectively, and 15A through F mounted therein in a one-to-one aligned relationship. Slidably mounted on the guide rails are a plurality of circuit board modules 17 having numerous heat generating electronic components 18 mounted on a heat conducting plate 19. The circuit board module 17 illustrated is only one type of design, and there are numerous other configurations that such a module can take and, thus, the design shown is for purposes of illustration only. The circuit board module 17 contains an electrical connector half 20A for mating to an electrical connector half 20B mounted on the mother board 24 in the rear of the Enclosure 10.

Illustrated in FIG. 3 is a cross-sectional view of FIG. 2 taken along the line 3—3 particularly illustrating the method of clamping the circuit board module 17 to the guide rails 14A through F and 15A through F. Still referring to FIGS. 1 and 2, and additionally to FIG. 3, it can be seen that in order to transfer the heat through the plate 19 to the guide rails, good thermal contact must be obtained, which is partially a function of the clamping force. There are numerous commercially available mechanisms for clamping such circuit board modules. For purposes of illustration, an existing clamp mechanism, indicated by numeral 30, is shown. The mechanism 30 comprises a flange number 32 extending perpendicular from the plate 19 near the periphery thereof. Mounted on the flange number 32 are a pair of guide blocks 34A and 34B extending parallel to and spaced from the plate 19 forming a channel 36 for the guide rails 14A through D. The blocks 34A and 34B include beveled ends 38A and 38B, respectively, beveled inward toward channel 36 and incorporate through holes 40A and 40B, respectively therethrough. The mechanism 30 further includes a pair of wedge blocks 42A and 42B having beveled surfaces 44A and 44B in slidable contact with beveled surface 38A and 38B of blocks 34A and 34B, respectively. The wedge block 42A has a threaded hole 50A while block 52B includes a through hole 50B. A screw 51 having a head 52 with drive socket 54 therein extends through the hole in wedge block 42B, holes 40A and 40B in blocks 34A and 34B, respectively, and threadably engages the hole 50A in wedge block 42A loosely holding the wedge blocks 42A and 42B to blocks 34A and 34B. With the holes 40A and 40B larger than the hole 50A, the wedge blocks 42A and 42B can move toward and into the channel 36 sliding over the blocks 34A and 34B. Thus, with the circuit board module heat conducting plate 19 mounted in the channel 36, the rotation of the screw 51 will cause the wedge members 42A and 42B to be drawn together sliding across the bevel ends 38A and 38B and into contact with the plate 19 clamping it against the guide rail making solid contact therewith, providing excellent thermal heat transfer between the two.

Illustrated in FIG. 4 is a perspective view of plate 12A while illustrated in FIGS. 5, 6 and 7 are cross-sectional views thereof taken along the lines 5—5, 6—6 and 7—7. To reduce weight, the backside 55 of the plate 12A has been machined out to form a recess 56 reducing the thickness of the wall 57 to a minimum. The recess 56 has been filled with foam 58, foamed in place or bonded in sheet form to provide stiffness for the wall 57. A cover plate 59 is bonded to the backside 55 covering the foam 58.

The rail 14D and every other rail, 14A, B, C, E, F and 15A through F incorporates a passage therein and, as illustrated, a serpentined passage 60. It should be noted that any pattern could be used, however, the serpentine provides an effective expansion chamber for the conversion of liquid to vapor by the addition of heat due to the heat of vaporization of the specific coolant. In phase-change mode, which is the most volumetric efficient coolant mode, the serpentined passage acts effectively as an evaporator. The serpentined path, plus the rapid linear flow of the liquid therewithin causes a stirring action that removes any vapor that is attached to the wall permitting further wetting of the heat source surface by the unvaporized liquid. Any reduced stirring action will cause vapor build-up on the walls, thereby causing the phase change system to stall and limit the cooling function. The passage 60 extends into the guide rail 14D about its full length 61. Through holes 62 and 64 are provided in the flange members 66 and 68, respectively, which extend from end 70 to the guide rail 14F of the plate 12A. The holes 62 and 64 are joined to the ends of the passage 60 by means of passages 72 and 74. Again, please note that all the guide rails are similarly designed.

Referring back to FIG. 1 and still to FIG. 4, it can be seen that external fluid couplings 82 and 84 are joined to the passages 62 and 64 at end 70. Such fluid couplings are conventional, and thus, the detailed design thereof need not be discussed. Additional external fluid couplings 82A and 84A contact the passages 62 and 64 in rails 15A through 15F. These fluid couplings connect the cabinet to a coolant circulating system 86 which will be subsequently discussed.

Referring to FIG. 8, plates 12A and 12B can be easily manufactured by first braising together seven blocks identified by the numerals 90A through 90G. The blocks 90B through 90G first 11 have the passages 60, 72 and 74 machined therein. Passages 62 and 64 are drilled completely through blocks 90A through 90F and thereafter the blocks are furnace brazed together. The braized blocks are then machined and the foam 58 and cover sheet 59 are added to complete the plates 12A and 12B.

Particularly referring to FIG. 9, it can be seen that each of the serpentine passages 60 in the guide rails 14A through 14F and also serpentine passages 60 in rails 15A through 15F are joined by the couplings 82 and 84 (82A and 84A) to the coolant circulating system 86 (see also FIG. 1). For purposes of illustration, FIG. 9 only illustrates the coolant circulation system 86 connected to the couplings 82 and 84; however, it must be understood that it is simultaneously coupled to couplings 82A and 84A.

Essentially, a fluid line 100 is coupled at one end to coupling 82 and the opposite end to coupling 84. Mounted in series within this line is a first temperature sensor 102, an outlet control valve 106, a quick disconnect 108, compressor 110, condenser 112, filter/dryer 114, another quick disconnect 116, an inlet control valve 118, and finally a second temperature sensor 119. A control circuit 120 is electrically coupled via wires 122 and 124 to temperature sensors 119 and 102, and is also electrically coupled via electrical lines 126 and 128 to inlet and outlet valves 118 and 106, respectively. The control circuit 120, by sensing the inlet and outlet temperatures of the coolant fluid flowing to and from the enclosure 10 can regulate the extent of the phase change of the coolant as it passes through the serpentine passages 60 by adjusting the inlet valve 118 and outlet valve 106 to maintain the proper flow. The amount of coolant flow, of course, will depend upon the number of electronic components within the enclosure 10 which are in operation at any given time. Thus, by proper regulation of the coolant flow "nucleate boiling", a special form of phase change cooling, can be accomplished. This coupled with the use of the serpentine coolant passages to create a turbulant flow to scrub the walls thereof of vapor increasing the "wetting" of the surfaces with liquid coolant promotes efficient cooling. The potential cooling ability of using these "phase change" cold rails is in excess of 100 watts/per rib, for a rail that contains one square inch of contact surface. This is considerably greater than existing methods which have approximately an 8 watt/per rail capability for air cooling and 15 watts/per rail capability for liquid cooling. Furthermore, because the phase change cooling is uniform over the entire enclosure, the temperature of each module remains the same.

For example, in a 30 circuit board module enclosure using conventional heat transfer techniques would require approximately 4½ gallons per minute of a coolant such as Coolanol, based on a temperature rise of the coolant of 15° C. from one end of the enclosure to the other. The circuit modules near the inlet would be operating at a 15° C. higher temperature than the circuit modules near the coolant outlet. By comparison, the subject system using nucleate boiling phase change cooling would require only two gallons per hour of coolant which would provide a significant reduction in weight. Additionally, the temperature would be lowered significantly by some 30° C., and the temperature of the circuit modules at the inlet and outlet would be substantially identical.

While the invention has been described with reference to a particular embodiment, it should be understood that the embodiments are merely illustrative as there are numerous variations and modifications which may be made by those skilled in the art. Thus, the invention is to be construed as being limited only by the spirit and scope of the appended claims.

Industrial Applicability

The invention has applicability to electronic systems and, in particular, to electronic systems requiring liquid cooling of the heat generating components.

I claim:

1. A modular electronic system comprising:
    a housing assembly having first and second opposed plates, said opposed plates having a plurality of spaced guide rails thereon;
    a plurality of electronic modules, each of said modules having a metallic frame, each said metallic frame being slidably mounted to said opposed guide rails and detachably (clampable) clamped thereto;
    a cooling system comprising:
        each of said guide rails having internal serpentine cooling passages extending substantially the entire length thereof, said internal cooling passages having first and second ends;
        each of said opposed plates having a cooling inlet passage coupling said first end of said internal passages in parallel and a cooling outlet passage coupling said second ends of said internal passages in parallel; and
        means for circulating cooling fluid through said plate and rail passages so as to maintain a nucleate boiling phase change of the coolant within said rail passages.

2. The system as set forth in claim 1 wherein said electronic modules are detachably (clampable) clamped to said rails by means of thermal clamps.

* * * * *